March 28, 1967 B. DANKER 3,311,838

RECEIVER FOR THE RECEPTION OF AM SIGNALS AND FM SIGNALS WITH TUNING INDICATION

Filed July 31, 1963

INVENTOR.
BEREND DANKER
BY
Frank R. Trifari
AGENT

United States Patent Office 3,311,838 Patented Mar. 28, 1967

3,311,838

RECEIVER FOR THE RECEPTION OF AM SIGNALS AND FM SIGNALS WITH TUNING INDICATION

Berend Danker, Emmasingel, Eindhoven, Netherlands, assignor to North American Philips Company, Inc., New York, N.Y., a corporation of Delaware Filed July 31, 1963, Ser. No. 298,972
Claims priority, application Netherlands, Aug. 21, 1962, 282,335
5 Claims. (Cl. 329—111)

This invention relates to a receiver for the reception of AM signals and FM signals and having a tuning indicator. Such receivers have an AM detector and an FM detector.

Tuning indication is usually obtained by means of a vacuum tube specially designed for this purpose (e.g. a "magic eye") which contains a fluorescent anode. The supply voltage required for such a tube is, however, several hundred volts. Such a supply voltage is not available in many receivers, for example in transistor receivers.

A second problem which arises if a tuning indicating device is desired in a receiver suitable for the reception of AM signals as well as FM signals resides in the fact that the tuning indicating device has to be controlled on FM reception in a manner different from than on AM reception. It is objectionable to provide an additional switch section on the AM–FM switch intended for switching over the receiver from AM reception to FM reception for this purpose, on the one hand because this results in a switch which is more costly and takes up more space and, on the other hand, because it is usually necessary for this purpose to provide long conducting wires in the receiver leading to the switch. The latter drawback becomes manifest more particularly in so-called printed circuits in which the design of the wiring becomes much more complicated with long connecting leads.

An object of the invention is to obviate these disadvantages. The receiver according to the invention, comprises a direct-current indicator for tuning indication that is included in a direct-current circuit of the AM detector as well as in a direct-current circuit of the FM detector.

In U.S. Patent No. 3,249,872 a direct-current indicator is connected in the direct-current circuit of a ratio-detector. An additional switch section is avoided by including the direct-current indicator also in the collector circuit of an intermediate-frequency transistor controlled by an AVC voltage. The above-mentioned disadvantages are also solved in this way; the current of the intermediate-frequency transistor which flows through the indicator in FM reception, gives rise, however, to a bias potential on the FM detector, which may be objectionable in certain cases, since a special compensating network has to be provided.

Such a compensating network may be avoided by using an indicator having, for example, two current coils or only one current coil having a tap. In circuit arrangements according to the invention, however, it is possible to use a simple instrument which is of a current type without a compensating network being required.

Figure 1:
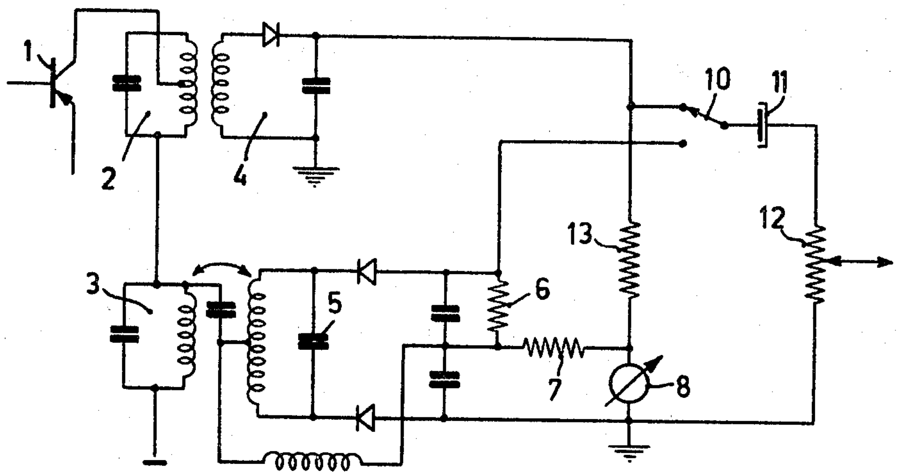
Figure 2:
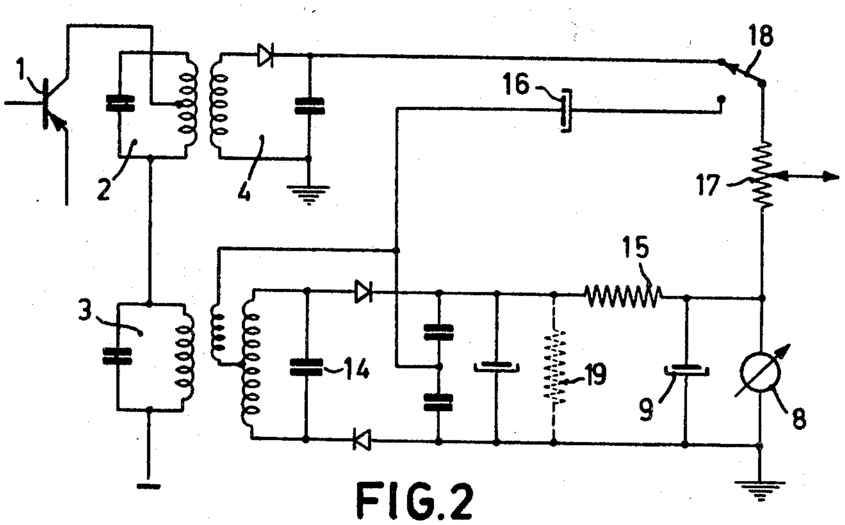

In order that the invention may be readily carried into effect, it will now be described in detail, by way of example, with reference to the accompanying diagrammatic drawing, in which:

FIGURE 1 shows a first embodiment of a circuit arrangement according to the invention, and FIGURE 2 shows a second embodiment of a circuit arrangement according to the invention.

FIGURE 1 shows the detector portion of an AM–FM radio receiver. A transistor 1 serves as an amplifying element for both the amplitude-modulated intermediate-frequency signal and the frequency-modulated intermediate-frequency signal. The collector circuit of this transistor includes in series two parallel resonant circuits 2 and 3 which are tuned, respectively, to the intermediate frequency of the AM signal and to the intermediate frequency of the FM signal. An AM detector 4 is coupled to the resonant circuit 2 and an FM detector 5 is coupled to the resonant circuit 3. The operation of the two detectors is known per se and therefore needs no further explanation. The FM detector 5 is known as the Foster-Seeley discriminator. This circuit includes two resistors 6 and 7 through which the two direct-current circuits of the discriminator are completed.

A direct-current tuning indicator 8 is included in series with the resistor 7. The direct current flowing through resistor 7 thus also flows through the indicator 8 and this direct current increases as the amplitude of the intermediate frequency signal applied to the FM detector 5 increases, that is to say, as the receiver is tuned better to the relevant FM transmitter. The deflection of the indicator is thus a measure of the proper tuning of the receiver. The fact that the low-frequency audio-component of the current flowing through resistor 7 also flows through the indicator is not objectionable when the indicator is sufficiently slow in response.

The low-frequency audio-voltage produced across the series-combination of the resistors 6 and 7 during FM reception is applied through a switch section 10 of the AM–FM switch and a coupling capacitor 11 to a potentiometer 12 which fulfills the function of a volume control. The sliding contact of said potentiometer is connected to the input of a low-frequency amplifier (not shown).

The direct-current circuit of the AM detector is completed by a load resistor 13. The low-frequency audio-signal produced across this resistor is also applied through the switch section 10 and the coupling capacitor 11 to the potentiometer 12.

According to the invention, the resistor 13 is not connected directly to ground, but is connected through the direct-current indicator 8 included in one of the direct-current circuits of the Foster-Seeley discriminator. The direct-current component of the current flowing through resistor 13 thus also flows through the indicator 8 and since this direct current is dependent on the mean amplitude of the intermediate-frequency signal applied to the AM detector, the indicator also gives an indication of the tuning of the receiver on AM reception.

The invention is based more particularly on recognition of the fact that it is possible to obtain from the two detectors a direct current sufficient for control of the indicator, so that the interposition of a direct-current amplifying element, with the disadvantages involved, is not required. It should be noted that the sensitivity of the indicator is not detrimentally affected by the fact that the indicator is included in both detector circuits. In fact, during AM reception, the FM detector does not constitute a leak path for the direct voltage produced across the indicator since the diode of the FM detector which is connected to ground is biased in the cut-off condition by said direct voltage. Similarly, during FM reception, the AM detector does not constitute a leak path for the direct voltage produced across the indicator, since the diode of the AM detector is cut off as a result of this voltage.

Furthermore, since the FM detector is inactive during AM reception and, similarly, the AM detector is inactive during FM reception it is not necessary to take special steps for minimizing the direct voltage across the indicator. It is therefore not necessary to use a direct-current indicator having a very low resistance, so that an indicator of sufficient sensitivity can be used.

A second embodiment of a circuit according to the invention is shown in FIGURE 2. Circuit elements of this embodiment corresponding to those of FIGURE 1 are indicated by the same reference numerals.

In the embodiment shown in FIGURE 2, the FM signals are detected by a ratio-detector 14. The direct-current circuit of this ratio-detector is completed by a resistor 15 and the direct-current indicator 8 connected in series with the resistor 15. The direct current flowing through this series-combination during FM reception increases as the amplitude of the intermediate-frequency signal applied to the ratio-detector increases, and hence the deflection of the indicator 8 increases as the receiver is tuned better to an FM transmitter. The low-frequency audio signal delivered by the ratio-detector is applied through a coupling capacitor 16 and a switch section 18 of the AM–FM switch to a potentiometer 17 which fulfils the function of a volume control.

In this embodiment of the invention, the potentiometer 17 is used not only as a volume control, but also as a direct-current load resistance of the AM detector and, according to the invention, the potentiometer is thus connected in series with the indicator 8. The switch section 18 is connected between the load resistance 17 of the AM detector and the remaining portion of this detector, so that the switch section has a dual function: on the one hand, it causes either the detected AM signal or the detected FM signal, dependent upon the position of the movable contact, to be applied to the volume control and, on the other hand, it switches the indicator 8 into or out of the direct-current circuit of the AM-detector. So, a resistor is economized in the circuit shown in FIGURE 2. However, in this case, the capacitor 9 is preferably connected in parallel with the indicator so that no low-frequency audio voltage is produced across the indicator during AM reception; this is desirable to prevent the receiver from delivering a residual signal when the volume control has been turned back completely.

As in the circuit shown in FIGURE 1, in the second embodiment the direct voltage produced across the indicator 8 does not leak away through the detector which is not in operation and hence the sensitivity of the indicator is not detrimentally affected. This is prevented during FM reception by the switch section 18 which interrupts the connection between the indicator and the AM detector during FM reception. During AM reception, the direct voltage produced across the indicator is prevented from leaking away through the FM detector due to the two diodes present in the ratio-detector being in the cut-off direction as a result of said direct voltage. In the embodiment shown in FIGURE 2, it is likewise possible to use a high resistance and hence sensitive instrument as the direct-current indicator.

In practice, the following values were used in the circuit shown in FIGURE 2:

| | | |
|---|---|---|
| $R_{15}$ | ohms | 22,000 |
| $R_{17}$ | do | 10,000 |
| $R_8$ | do | 1,000 |
| $C_9$ | $\mu$f | 1 |

It is desirable that an AM transmitter and an FM transmitter each delivering the maximum permissible high-frequency signal to the input of the receiver also cause equal deflections of the indicator 8. This may be achieved by correct choice of the direct-current load resistance of the detectors or by bypassing the direct current of one of the detectors partly around the indicator. If, for example, the maximum FM signals to be received cause deflections of the indicator 8 larger than those caused by the maximum AM signals to be received, an additional resistor 19 is included, as shown in FIGURE 2, through which flows a portion of the direct current produced by the FM detector.

What is claimed is:

1. A tuning indicator circuit for a receiver for amplitude and frequency modulated signals; said receiver being of the type having an amplitude demodulator with first load resistance means through which a first direct current flows in one direction in response to the reception of amplitude modulated signals, and a frequency modulation detector with second load resistance means through which a second direct current flows in one direction in response to the reception of frequency modulated signals; said tuning indicator circuit comprising a current indicating device having first and second terminals, means continuously connecting said first terminal to a point of constant potential, and means continuously connecting said second terminal to an end of each of said first and second load resistance means, whereby said first and second direct currents flow through said current indicating device.

2. A tuning indicator circuit for a receiver for amplitude and frequency modulated signals; said receiver being of the type having an amplitude demodulator with first diode means and a source of amplitude modulated signals connected between a point of reference potential and an electrode of said first diode means, and a frequency demodulator having second and third diode means and a source of frequency modulated signals connected between an electrode of each of said second and third diode means; said tuning indicator circuit comprising means connecting the other electrode of said second diode means to said point, a current indicating device having first and second terminals, means connecting said first terminal to said point, first load resistance means connected between said second terminal and the other electrode of said third diode means whereby direct current flows through said indicating device in one direction in response to the reception of frequency modulated signals, said indicating device being continuously connected in the above described relationship with respect to said frequency demodulator, second load resistance means for said amplitude demodulator, means for continuously connecting one end of said second load resistance means to said second terminal, and direct current conductive means for connecting the other electrode of said first diode means to the other end of said second load resistance means, whereby direct current flows in said indicating device in said one direction in response to the reception of amplitude modulator signals.

3. A tuning indicator circuit for a receiver for amplitude and frequency modulator signals, comprising an amplitude detector having a first diode and including means for applying amplitude modulated signals between a point of reference potential and an electrode of said first diode, a Foster-Seeley discriminator having second and third diodes connected to first and second load resistor means respectively through which direct current flows in response to the reception of frequency modulated signals, said first load resistor means including a current indicating device having a first and second terminals, and means connecting said first terminal to said point, and a load resistor for said amplitude detector connected between the said other electrode of said first diode and said second terminal, whereby a direct current flows through said indicating device in response to the reception of amplitude modulated signals, said first diode having such a polarity that the voltage developed across said indicating device in response to the reception of amplitude modulated signals cuts off said second diode, all the above interconnections being continuous for the reception of both amplitude and frequency modulated signals.

4. A tuning indicator circuit for a receiver for amplitude and frequency modulated signals, comprising an amplitude detector having a first diode and including means for applying amplitude modulated signals between a point of reference potential and an electrode of said first diode, a frequency discriminator circuit comprising second and third diodes, means applying frequency modulated signals between first like terminals of said second and third diodes, first and second load resistor means, means connecting said first and second load resistor means to said second and third diodes respectively whereby direct currents flow in said first and second load resistor means in response to the reception of frequency modulated signals, said first load resistor means comprising a current indicating device having first and second terminals, and means connecting said first terminal to said point, third load resistor means connected between the other electrode of said first diode and said second terminal whereby direct current flows through said current indicating device in response to the reception of amplitude modulated signals, all the above interconnections being continuous for the reception of both amplitude and frequency modulated signals, an output circuit, and means for selectively connecting said detector and discriminator to said output circuit.

5. A tuning indicator circuit for a receiver for amplitude and frequency modulator signals, comprising an amplitude detector having a first diode and including means for applying amplitude modulated signals between a point of reference potential and an electrode of said first diode, a ratio detector circuit comprising second and third diodes, means applying said frequency modulated signals between unlike electrodes of said second and third diodes, first load resistance means connected between the receiving electrodes of said second and third diodes whereby direct current flows through said first load resistance means in response to the reception of frequency modulated signals, said first load resistance means comprising a current indicating device having first and second terminals, and means connecting said first terminal to said point, a second load resistance means having one end connected to said second terminal, all the above interconnections being continuous for the reception of both amplitude and frequency modulated signals, means for selectively connecting the other end of said second load resistance means to the other electrode of said first diode and a signal output point of said ratio detector circuit, and an output circuit connected to said second load resistance means.

References Cited by the Examiner

UNITED STATES PATENTS

| | | | |
|---|---|---|---|
| 2,189,300 | 2/1940 | Roberts | 329—111 X |
| 2,999,927 | 9/1961 | Birkenes | 329—203 X |

OTHER REFERENCES

Allied Radio Catalogue 200, 1961, p. 31, copy in Group 230.

KATHLEEN H. CLAFFY, *Primary Examiner.*

R. LINN, *Assistant Examiner.*